US009478226B2

(12) United States Patent
Oh et al.

(10) Patent No.: US 9,478,226 B2
(45) Date of Patent: *Oct. 25, 2016

(54) METHOD AND APPARATUS FOR ENCODING AND DECODING NOISE SIGNAL

(71) Applicant: SAMSUNG ELECTRONICS CO., LTD., Suwon-si (KR)

(72) Inventors: Eun-mi Oh, Seongnam-si (KR); Anton Porov, Yongin-si (KR); Jung-hoe Kim, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/879,430

(22) Filed: Oct. 9, 2015

(65) Prior Publication Data

US 2016/0035362 A1 Feb. 4, 2016

Related U.S. Application Data

(63) Continuation of application No. 14/691,976, filed on Apr. 21, 2015, now Pat. No. 9,159,332, which is a continuation of application No. 13/607,991, filed on Sep. 10, 2012, now Pat. No. 9,025,778, which is a continuation of application No. 11/924,827, filed on Oct. 26, 2007, now Pat. No. 8,265,296.

(30) Foreign Application Priority Data

Mar. 7, 2007 (KR) ........................ 10-2007-0022574

(51) Int. Cl.
*H01L 21/00* (2006.01)
*G10L 19/028* (2013.01)
*G10L 19/02* (2013.01)
*G10K 11/00* (2006.01)

(52) U.S. Cl.
CPC ........... *G10L 19/028* (2013.01); *G10K 11/002* (2013.01); *G10L 19/0204* (2013.01)

(58) Field of Classification Search
CPC ............ G10L 19/0204; G10L 19/028; G10K 11/002
See application file for complete search history.

(56) References Cited

U.S. PATENT DOCUMENTS 5,680,130 A 10/1997 Tsutsui et al.
5,692,102 A 11/1997 Pan
5,805,770 A 9/1998 Tsutsui (Continued)

FOREIGN PATENT DOCUMENTS

KR 1020060070693 6/2006
WO 94/28633 12/1994

OTHER PUBLICATIONS

International Search Report issued May 26, 2008 in corresponding International Patent No. PCT/KR2008/1185.

(Continued)

*Primary Examiner* — Richard Booth
(74) *Attorney, Agent, or Firm* — Staas & Halsey LLP

(57) ABSTRACT

Provided is a method and apparatus for encoding/decoding an audio signal. Sections which are not used to output noise components near important spectral components and sub-bands which are not used to output noise components, are determined to be encoded or decoded, so that the efficiency of encoding and decoding an audio signal increases, and sound quality can be improved using less bits.

2 Claims, 16 Drawing Sheets

(56) References Cited

U.S. PATENT DOCUMENTS

| | | | |
|---|---|---|---|
| 6,952,482 | B2 | 10/2005 | Balan et al. |
| 7,676,046 | B1 | 3/2010 | Nelson et al. |
| 7,835,907 | B2 | 11/2010 | Kim et al. |
| 7,945,058 | B2 | 5/2011 | Lee et al. |
| 8,265,296 | B2 | 9/2012 | Oh et al. |
| 9,025,778 | B2 | 5/2015 | Oh et al. |
| 9,159,332 | B2 * | 10/2015 | Oh et al. |
| 2006/0136198 | A1 | 6/2006 | Kim et al. |
| 2010/0092000 | A1 | 4/2010 | Kim et al. |

OTHER PUBLICATIONS

U.S. Office Action issued Aug. 23, 2011 in corresponding U.S. Appl. No. 11/924,827.

U.S. Office Action mailed Jan. 19, 2012 in corresponding U.S. Appl. No. 11/924,827.

U.S. Notice of Allowance issued May 10, 2012 in corresponding U.S. Appl. No. 11/924,827.

U.S. Restriction Requirement issued Nov. 19, 2012 in corresponding U.S. Appl. No. 13/607,991.

U.S. Office Action issued Jan. 30, 2013 in corresponding U.S. Appl. No. 13/607,991.

U.S. Office Action issued Jul. 16, 2013 in corresponding U.S. Appl. No. 13/607,991.

U.S. Notice of Allowance issued Dec. 9, 2013 in corresponding U.S. Appl. No. 13/607,991.

U.S. Office Action issued May 22, 2014 in corresponding U.S. Appl. No. 13/607,991.

U.S. Notice of Allowance issued Sep. 15, 2014 in corresponding U.S. Appl. No. 13/607,991.

U.S. Notice of Allowance issued Jan. 12, 2015 in corresponding U.S. Appl. No. 13/607,991.

U.S. Notice of Allowance issued Jun. 12, 2015 in copending U.S. Appl. No. 14/691,976.

U.S. Appl. No. 14/691,976, filed Apr. 21, 2015, Eun-mi Oh, Samsung Electronics Co., Ltd.

* cited by examiner

METHOD AND APPARATUS FOR ENCODING AND DECODING NOISE SIGNAL

CROSS-REFERENCE TO RELATED APPLICATIONS

This application is a is a continuation of U.S. application Ser. No. 14/691,976 filed on Apr. 21, 2015, which is a continuation of U.S. application Ser. No. 13/607,991, filed on Sep. 10, 2012, patented as U.S. Pat. No. 9,025,778 on May 5, 2015, which is a continuation of U.S. application Ser. No. 11/924,827, filed on Oct. 26, 2007, patented as U.S. Pat. No. 8,265,296 on Sep. 11, 2012, which claims the benefit of Korean Patent Application No. 10-2007-0022574, filed on Mar. 7, 2007, in the Korean Intellectual Property Office, the disclosures of which are incorporated herein in their entirety by reference.

BACKGROUND OF THE INVENTION

1. Field of the Invention

The present invention relates to encoding/decoding an audio signal, and more particularly, to a method and apparatus for encoding and decoding a noise component except predetermined spectral components in an audio signal which is converted into the frequency domain.

2. Description of the Related Art

Encoding and decoding an audio signal require improving sound quality as much as possible by using a limited bit rate. To do this, spectral components in the audio signal, which may affect detection by a person, are allocated with many bits and encoded, and noise components except important spectral components are allocated with a few bits and encoded. Here, it is necessary to improve the quality of sound that can be perceived by a person by effectively using a few bits allocated to the noise components.

SUMMARY OF THE INVENTION

The present invention provides a method and apparatus for determining sections which are near important spectral components and are not to be output as noise components, or sub-bands which are not to output noise components, in order to be encoded and decoded.

Additional aspects and utilities of the present general inventive concept will be set forth in part in the description which follows and, in part, will be obvious from the description, or may be learned by practice of the general inventive concept.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
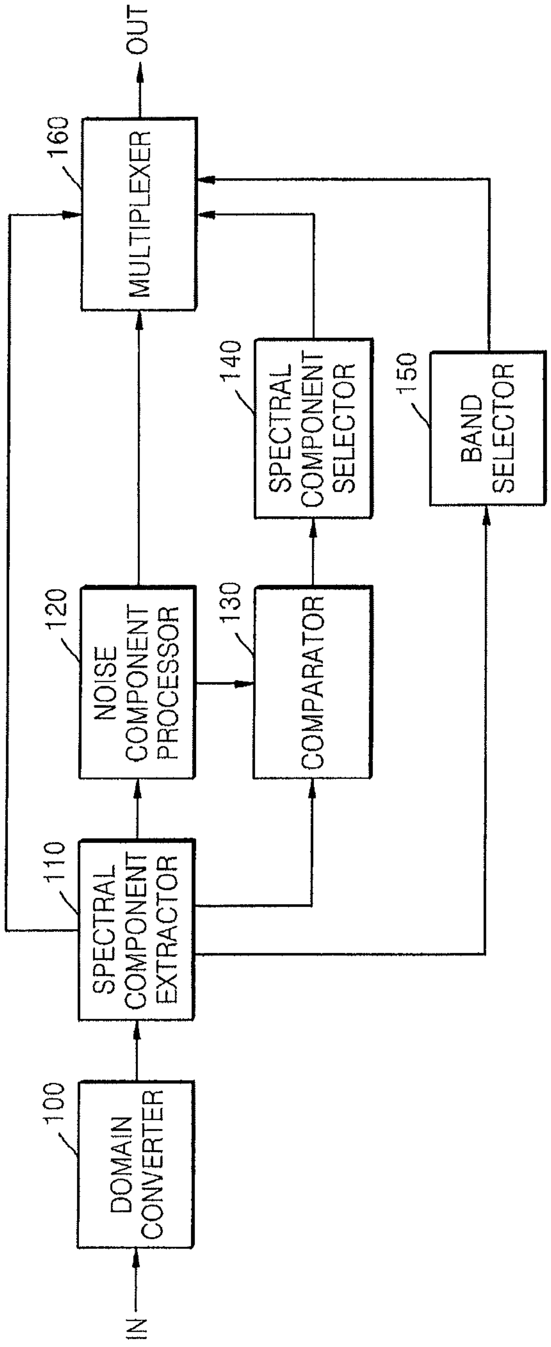
FIG. 1 is a block diagram showing an apparatus for encoding a noise signal according to an embodiment of the present invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram showing an apparatus for encoding a noise signal according to an embodiment of the present invention. The apparatus for encoding a noise signal includes a domain converter 100, a spectral component extractor 110, a noise component processor 120, a comparator 130, a spectral component selector 140, a band selector 150, and a multiplexer 160.

The domain converter 100 converts an input signal input through an input terminal IN from the time domain into the frequency domain.

The spectral component extractor 110 selects a predetermined number of spectral components on a predetermined basis from the signal converted into the frequency domain by the domain converter 100. For example, referring to FIG. 2, the spectral components selected by the spectral component extractor 110 are first to twelfth spectral components

200 to 255. In addition, the spectral component extractor 110 encodes the selected spectral components.

Here, the spectral component extractor 110 may select the spectral components by using the following methods. First, a signal-to-masking ratio (SMR) value is calculated, and signals having values larger than a masking threshold are selected as important frequency components. Second, in consideration of a predetermined weight value, a spectral peak is extracted, and important frequency components are selected. Third, a signal-to-noise ratio (SNR) value is calculated for each sub-band, and frequency components having peak values larger than a predetermined magnitude are selected from among sub-bands having low SNR values as important frequency components. The aforementioned three methods may be separately performed, or one or more methods may be combined and performed. The aforementioned three methods are only examples and the present invention is not limited thereto.

The noise component processor 120 calculates noise levels for noise components exclusive of the spectral components selected by the spectral component extractor 110 in the signal converted by the domain converter 100. The noise component processor 120 calculates the noise levels by separating the signal into sub-bands and calculating an energy value of a noise component for each sub-band. In addition, the noise component processor 120 encodes the noise level of each of the sub-bands.

The comparator 130 compares an energy value of each of the spectral components selected by the spectral component extractor 110 with a noise level of a sub-band including the corresponding spectral component. For example, the comparator 130 calculates a ratio value by dividing the energy value of each spectral component by the noise level of the sub-band that includes the corresponding spectral component.

The spectral component selector 140 selects, by using the result of the comparison performed by the comparator 130, spectral components which are not to be output as noise components corresponding to lengths of predetermined sections near the spectral components from among the spectral components selected by the spectral component extractor 110. For example, the spectral component selector 140 selects a spectral component having a ratio value obtained by dividing the energy value of each spectral component by the noise level of the corresponding sub-band that is larger than a predetermined value. In addition, the spectral component selector 140 encodes information on positions of the spectral components selected.

Figure 2:
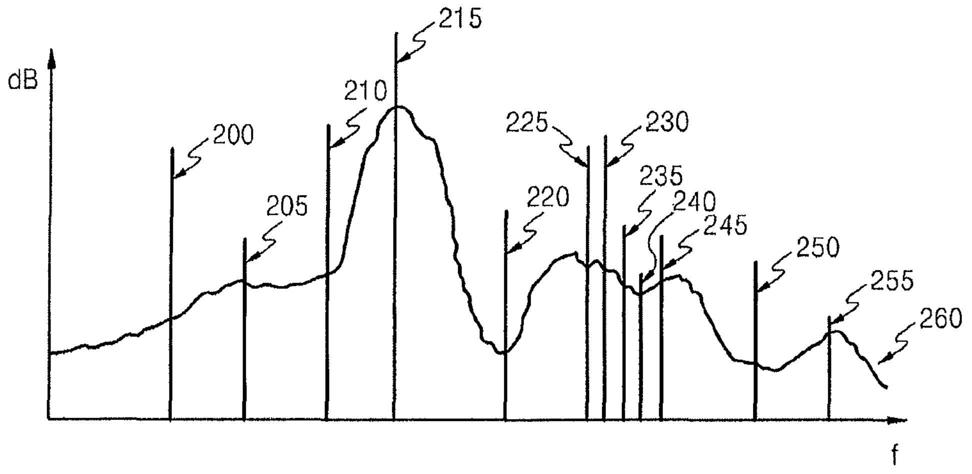
FIG. 2 is a graph for explaining a method and apparatus for encoding and decoding a noise signal according to an embodiment of the present invention.

For example, as shown in FIG. 2, it is assumed that the first to twelfth spectral components 200 to 255 are selected by the spectral component extractor 110, and a noise level is calculated by the noise component processor 120 as a curve 260. In addition, the spectral component selector 140 selects the first, third, fifth, seventh, and eleventh spectral components 200, 210, 220, 230, and 250 having ratio values obtained by dividing an energy value of each spectral component by a noise level of the sub-band including the corresponding spectral component, which are larger than the predetermined value.

The band selector 150 selects sub-bands having a number of the spectral components selected by the spectral component extractor 110 that is larger than a predetermined value. The band selector 150 determines whether the number of spectral components in each sub-band is larger than the predetermined value, because the sound quality is not significantly deteriorated in those sub-bands even when a decoding apparatus does not synthesize the corresponding noise components.

Figure 4:
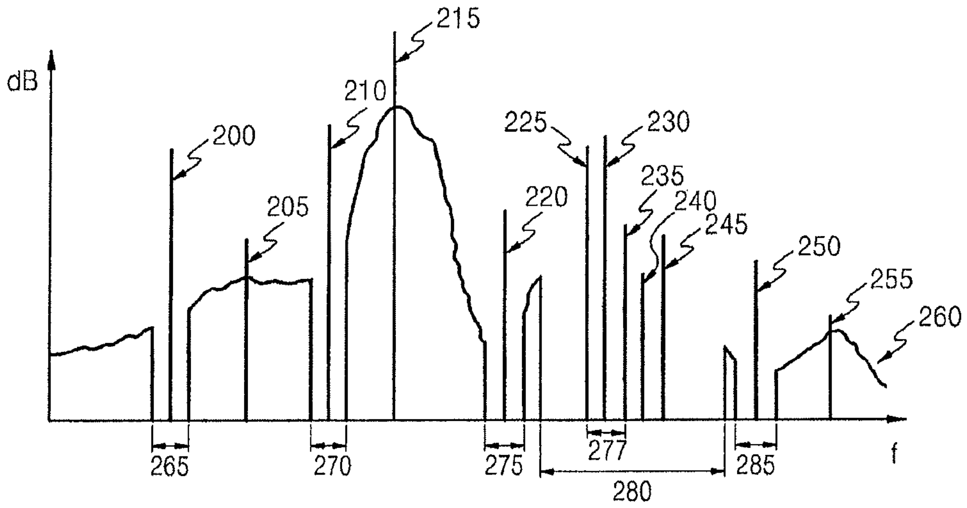
FIG. 4 is a graph for explaining a method and apparatus for encoding and decoding a noise signal according to an embodiment of the present invention.

For example, referring to FIG. 4, when it is assumed that the predetermined number of reference values which are used by the band selector 150 to select the sub-bands is four, the band selector 150 selects a sub-band 280 having five spectral components, the number of which is larger than the predetermined number four. In addition, the band selector 150 encodes information on the selected sub-bands. However, the apparatus for encoding a noise signal according to the current embodiment may not necessarily include the band selector 150.

The multiplexer 160 multiplexes the spectral components encoded by the spectral component extractor 110, the noise levels encoded by the noise component processor 120, information on the spectral components selected by the spectral component selector 140, and information on the sub-bands selected by the band selector 150. The multiplexer 160 generates a bit stream, which is output to an output terminal OUT.

Figure 3:
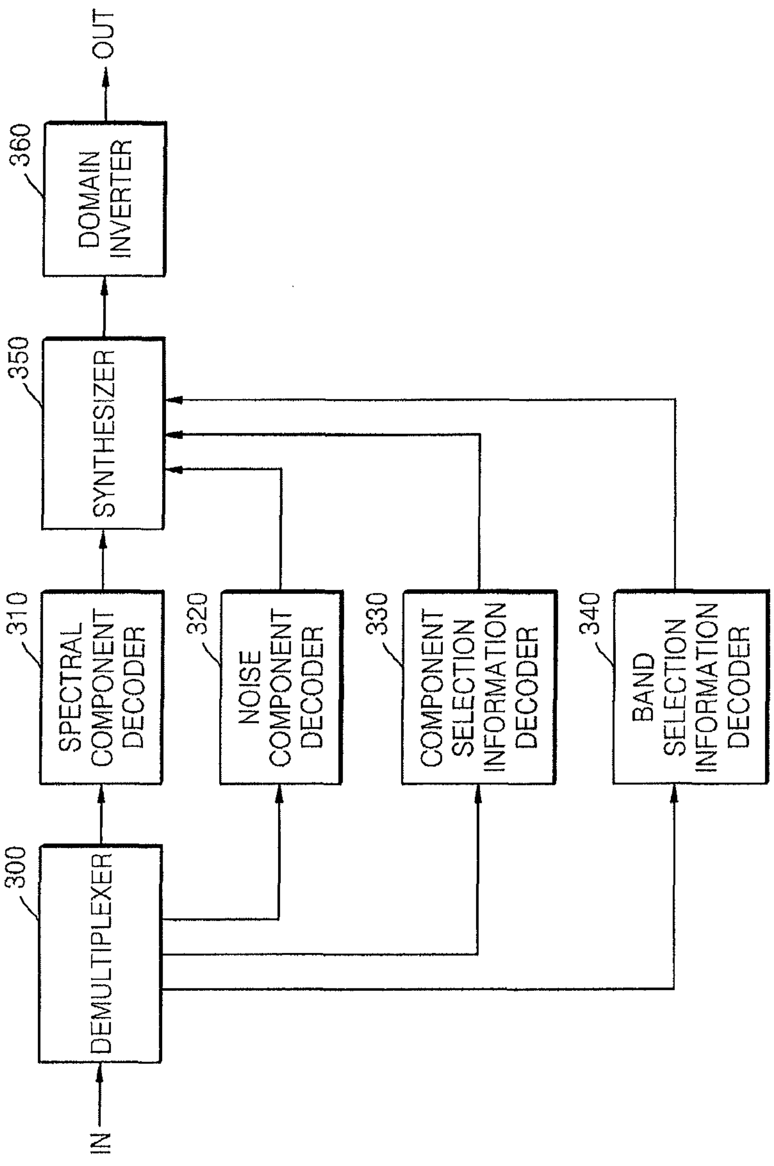
FIG. 3 is a block diagram showing an apparatus for decoding a noise signal according to an embodiment of the present invention.

FIG. 3 is a block diagram showing an apparatus for decoding a noise signal according to an embodiment of the present invention. The apparatus for decoding a noise signal includes a demultiplexer 300, a spectral component decoder 310, a noise component decoder 320, a component selection information decoder 330, a band selection information decoder 340, a synthesizer 350, and a domain inverter 360.

The demultiplexer 300 receives the bit stream transmitted from the encoding apparatus through an input terminal IN and demultiplexes the bit stream.

The spectral component decoder 310 decodes the spectral components that are selected from the audio signal on a predetermined basis and encoded by the encoding apparatus. Here, examples of the spectral components selected and encoded by the encoding apparatus include first to twelfth spectral components 200 to 255 shown in FIG. 4.

The noise component decoder 320 decodes noise components, except for the spectral components selected in the encoding apparatus. Here, an example of the noise components includes the curve 260 shown in FIG. 2.

The component selection information decoder 330 decodes information on the positions of the spectral components selected in the encoding apparatus as the spectral components which are not to be output as noise components corresponding to lengths of predetermined sections provided near the spectral components.

The band selection information decoder 340 decodes information on the sub-bands which are selected in the encoding apparatus as the sub-bands having spectral components selected from each sub-band and the number of which is larger than a predetermined value. In other words, the band selection information decoder 340 decodes information on the sub-bands which are not output as noise components. However, the apparatus for decoding a noise signal according to the current embodiment may not necessarily include the band selection information decoder 340.

The synthesizer 350 synthesizes the spectral components decoded by the spectral component decoder 310 with the noise components decoded by the noise component decoder 320.

Here, the synthesizer 350 synthesizes the spectral components with the noise components, but excluding the noise components corresponding to the lengths of the predetermined sections provided near the spectral components selected in the encoding apparatus according to the information on the positions of the spectral components decoded by the component selection information decoder 330. For example, referring to FIG. 4, the synthesizer 350 performs the synthesis excluding noise components in sections 265, 270, 275, 277, and 285 provided near the first, third, fifth, seventh, and eleventh spectral components 200, 210, 220, 230, and 250 corresponding to the spectral components selected in the encoding apparatus.

In addition, the synthesizer 350 performs the synthesis excluding noise components in sub-bands corresponding to the information on the sub-bands decoded by the band selection information decoder 340. For example, as shown in FIG. 4, the synthesizer 350 excludes noise components in sub-band 280.

The domain inverter 360 inverts the signal synthesized by the synthesizer 350 from the frequency domain to the time domain in order to output the inverted signal through an output terminal OUT.

Figure 5:
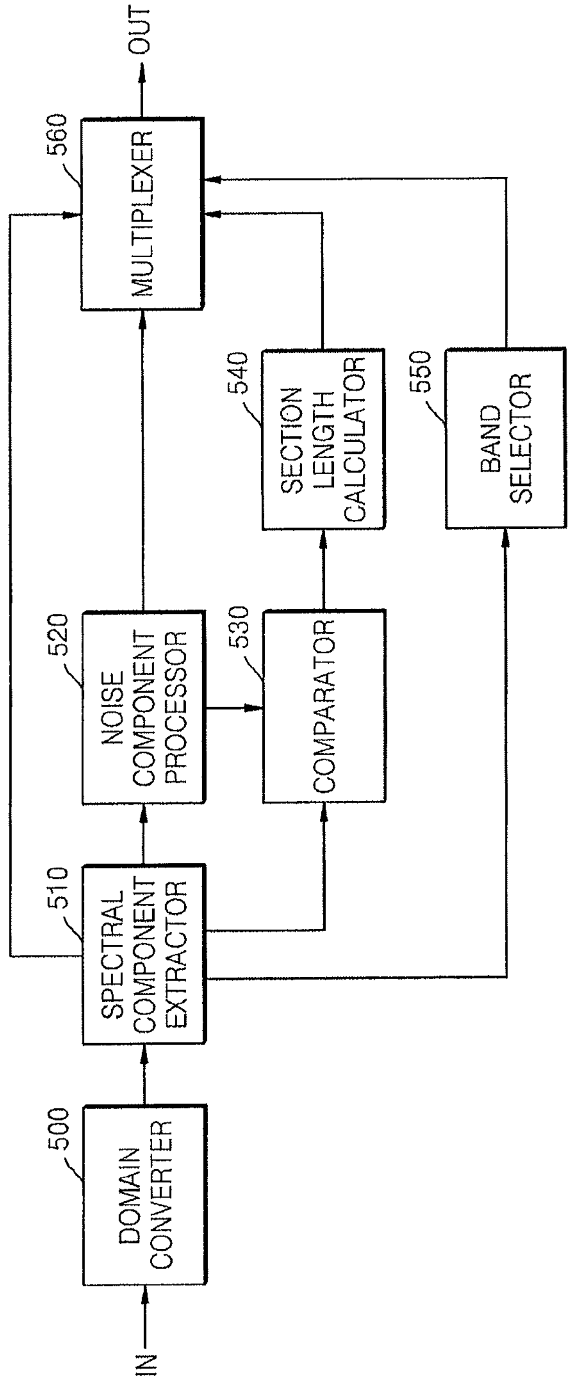
FIG. 5 is a block diagram showing an apparatus for encoding a noise signal according to another embodiment of the present invention.

FIG. 5 is a block diagram showing an apparatus for encoding a noise signal according to another embodiment of the present invention. The apparatus for encoding a noise signal includes a domain converter 500, a spectral component extractor 510, a noise component processor 520, a comparator 530, a section length calculator 540, a band selector 550, and a multiplexer 560.

The domain converter 500 converts an input signal input through an input terminal IN from the time domain into the frequency domain.

The spectral component extractor 510 selects a predetermined number of spectral components on a predetermined basis from the signal converted into the frequency domain by the domain converter 500. For example, referring to FIG. 6, the spectral components selected by the spectral component extractor 510 are first to twelfth spectral components 600 to 655. In addition, the spectral component extractor 510 encodes the selected spectral components.

Here, the spectral component extractor 510 may select the spectral components by using the following methods. First, an SMR value is calculated, and signals having values larger than a masking threshold are selected as important frequency components. Second, in consideration of a predetermined weight value, a spectral peak is extracted, and important frequency components are selected. Third, an SNR value is calculated for each sub-band, and frequency components having peak values larger than a predetermined magnitude are selected from among sub-bands having low SNR values as important frequency components. The aforementioned three methods may be separately performed, or one or more methods may be combined and performed. The aforementioned three methods are only examples and the present invention is not limited thereto.

The noise component processor 520 calculates noise levels for noise components except for the spectral components selected by the spectral component extractor 510 in the signal converted by the domain converter 500. The noise component processor 520 calculates the noise levels by separating the signal into sub-bands and calculating an energy value of a noise component for each sub-band. In addition, the noise component processor 520 encodes the calculated noise level of each sub-band.

The comparator 530 compares an energy value of each of the spectral components selected by the spectral component extractor 510 with a noise level of a sub-band including a corresponding spectral component. For example, the comparator 530 calculates a ratio value by dividing the energy value of each spectral component by the noise level of the sub-band including the corresponding spectral component.

The section length calculator 540 calculates lengths of spectral sections from which output noise components are not used near each of the spectral components extracted by the spectral component extractor 510 by using the result of the comparison performed by the comparator 530. In addition, the section length calculator 540 encodes the lengths of the sections calculated corresponding to each of the spectral components.

Here, the section length calculator 540 calculates the lengths of the sections which are not to output noise components to be proportionate to the energy of each spectral component extracted by the spectral component extractor 510 and ratio values of noise levels calculated by the noise component processor 520. For example, as shown in FIG. 6, as ratio values calculated by dividing energy values of the spectral components by noise levels of sub-bands including corresponding spectral components increase in the order of third, twelfth, first, second, and eleventh spectrum components 610, 655, 600, 605, and 650, lengths of sections are calculated to increase in the order of sections 675, 699, 665, 670, and 693 which are not to be used to output noise components corresponding to the spectrum components.

In addition, the section length calculator 540, when the number of spectral components selected by the spectral component extractor 510 in a predetermined interval is more than one, compares an energy value with a noise level of a spectral component for a smallest frequency from among the plurality of spectral components, provides a section which is not to be used to output noise components to a section smaller than the smallest frequency, and calculates a length of the section. In addition, the section length calculator 540 compares an energy value with a noise level of a spectral component for a largest frequency from among the plurality of spectral components, provides a section which is not to be used to output noise components to a section larger than the largest frequency, and calculates a length of the section.

Figure 6:
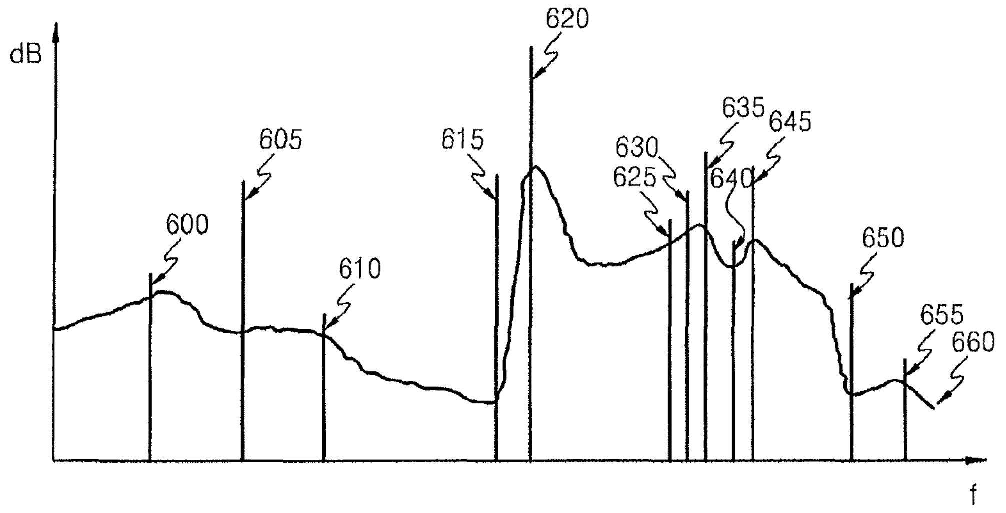
FIG. 6 is a graph for explaining a method and apparatus for encoding and decoding a noise signal according to another embodiment of the present invention.

For example, referring to FIG. 6, examples of spectral components close to each other include fourth to fifth spectral components 615 to 620 and sixth to tenth spectral components 625 to 645. For the fourth to fifth spectral components 615 to 620, an energy value and a noise level of the fourth spectral component 615 are compared with each other, a length of a section which is not to be used as output noise components is calculated for a section equal to or smaller than a frequency of the fourth spectral component 615, an energy value and a noise level of the fifth spectral component 620 are compared with each other, and a length of a section which is not to be used to output noise components is calculated for a section equal to or larger than a frequency of the fifth spectral component 620. Since a ratio value for the fourth spectral component 615 is larger than a ratio value for the fifth spectral component 620, the length of the section 680 smaller than the frequency of the fourth spectral component 615 is larger than the length of the section 685 larger than the frequency of the fifth spectral component 620. For the sixth to tenth spectral components 625 to 645, an energy value and a noise level of the sixth spectral component 625 are compared with each other, a length of a section which is not to output noise components is calculated for a section equal to or smaller than a frequency of the sixth spectral component 625, an energy value and a noise level of the tenth spectral component 645 are compared with each other, and a length of a section which is not to output noise components is calculated for a section equal to or larger than a frequency of the tenth spectral component 645.

The band selector 550 selects sub-bands having the spectral components selected by the spectral component extractor 510 and the number of which is larger than a predetermined value, from each sub-band. The band selector 550 determines whether the number of spectral components in each sub-band is larger than the predetermined value because the sound quality is not significantly deteriorated in such a sub-band even when a decoding apparatus does not synthesize the corresponding noise components. However, the apparatus for encoding a noise signal according to the current embodiment may not necessarily include the band selector 550.

For example, referring to FIG. 6, when it is assumed that the predetermined number of reference values which are used by the band selector 550 to select the sub-bands is four, the band selector 550 does not select a sub-band providing a plurality of spectral components corresponding to the fourth to fifth spectral components 615 to 620 in a unit sub-band as the number of spectral components is less than four. However, the band selector 550 selects a corresponding sub-band 690 including the sixth to tenth spectral components 625 to 645 in the unit sub-band when the number of spectral components is more than four.

The multiplexer 560 multiplexes the spectral components encoded by the spectral component extractor 510, the noise levels encoded by the noise component processor 520, information on the lengths of sections calculated corresponding to each of the spectral components by the section length calculator 540, and information on the sub-bands selected by the band selector 550 to generate a bit stream, and the bit stream is provided to an output terminal OUT.

Figure 7:
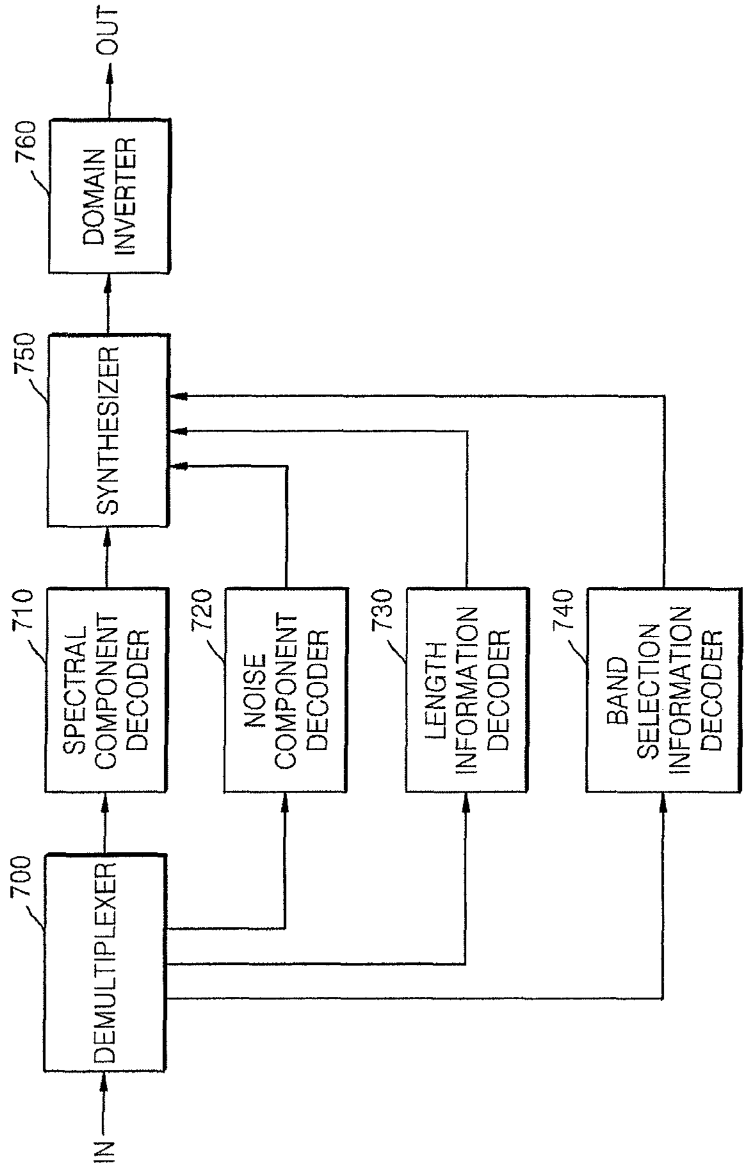
FIG. 7 is a block diagram showing an apparatus for decoding a noise signal according to another embodiment of the present invention.

FIG. 7 is a block diagram showing an apparatus for decoding a noise signal according to another embodiment of the present invention. The apparatus for decoding a noise signal includes a demultiplexer 700, a spectral component decoder 710, a noise component decoder 720, a length information decoder 730, a band selection information decoder 740, a synthesizer 750, and a domain inverter 760.

The demultiplexer 700 receives the bit stream transmitted from the encoding apparatus through an input terminal IN and demultiplexes the bit stream.

The spectral component decoder 710 decodes the spectral components that are selected from the audio signal on a predetermined basis and encoded by the encoding apparatus. Here, examples of the spectral components selected and encoded by the encoding apparatus include first to twelfth spectral components 600 to 655 shown in FIG. 6.

The noise component decoder 720 decodes noise components, excluding the spectral components selected in the encoding apparatus. Here, an example of the noise components includes a curve 660 shown in FIG. 6.

The length information decoder 730 decodes information on lengths of sections which are provided near each of the spectral components decoded by the spectral component decoder 710 and are not output as the noise components.

The band selection information decoder 740 decodes information on the sub-bands selected in the encoding apparatus as the sub-bands having spectral components selected from each sub-band, the number of which is larger than a predetermined value. However, the apparatus for decoding a noise signal according to the current embodiment may not necessarily include the band selection information decoder 740.

The synthesizer 750 synthesizes the spectral components decoded by the spectral component decoder 710 with the noise components decoded by the noise component decoder 720.

Here, the synthesizer 750 synthesizes the spectral components with the noise components excluding the noise components corresponding to the lengths of the sections for each of the spectral components decoded by the length information decoder 730. For example, referring to FIG. 8, the synthesizer 750 performs the synthesis excluding noise components in sections corresponding to lengths of the sections 665, 670, 675, 680, 685, 693, and 699 corresponding to the lengths of the sections of each of the spectral components decoded by the length information decoder 730.

Figure 8:
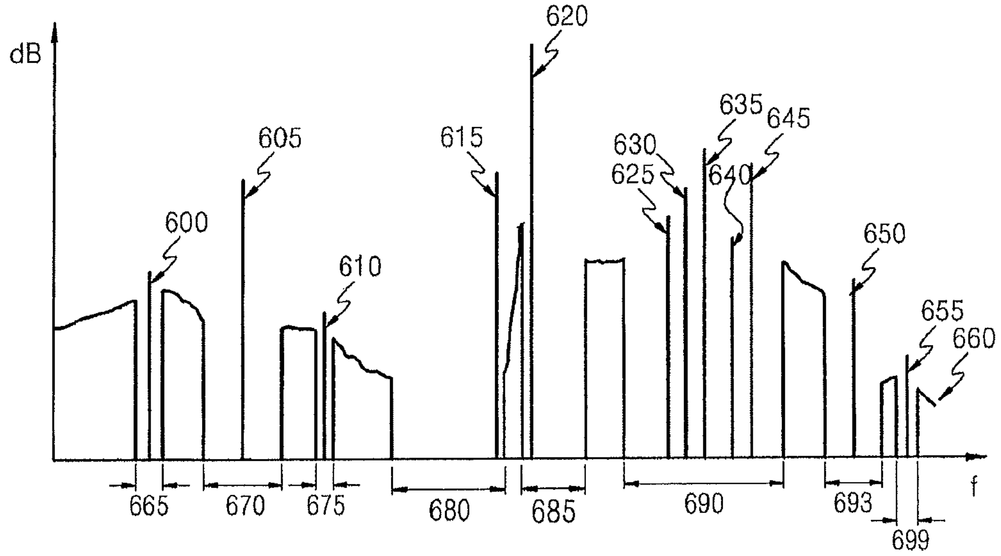
FIG. 8 is a graph for explaining a method and apparatus for encoding and decoding a noise signal according to another embodiment of the present invention.

In addition, the synthesizer 750 performs the synthesis excluding noise components in sub-bands corresponding to the information on the sub-bands decoded by the band selection information decoder 740. For example, as shown in FIG. 8, the synthesizer 750 performs the synthesis excluding noise components in sub-band 690.

The domain inverter 760 inverts the signal synthesized by the synthesizer 750 from the frequency domain to the time domain to output the inverted signal through an output terminal OUT.

Figure 9:
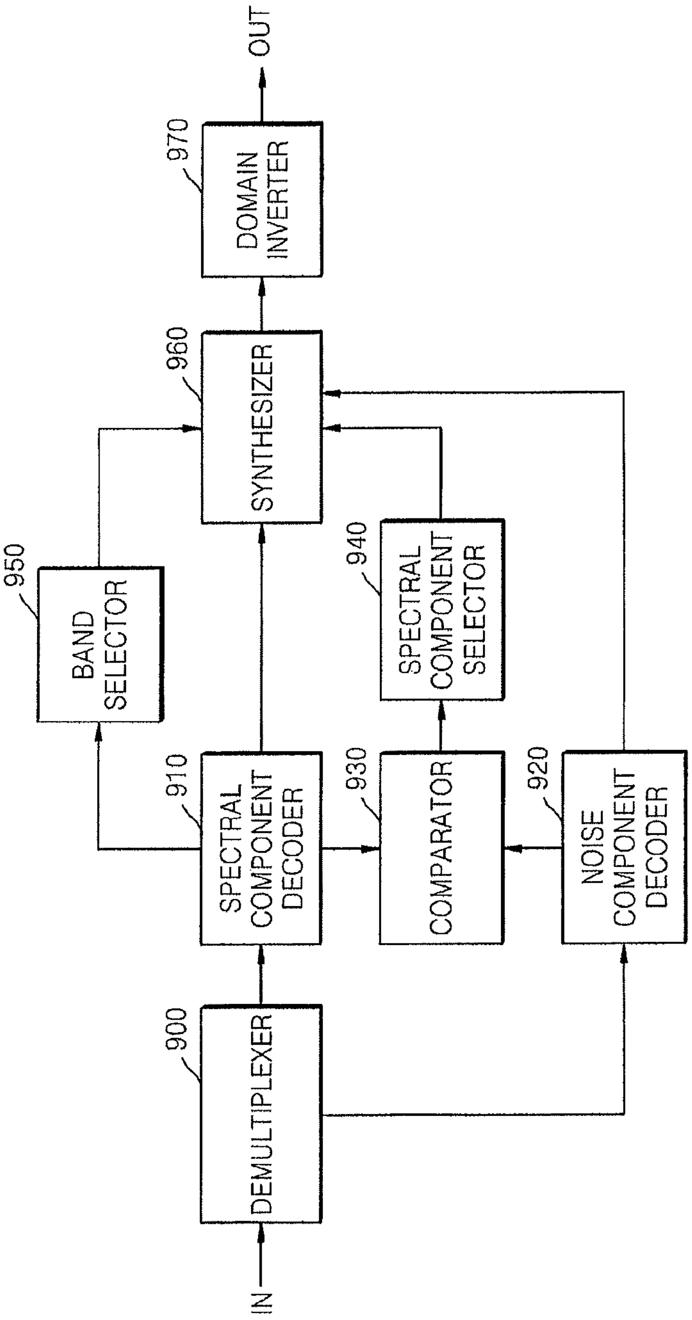
FIG. 9 is a block diagram showing an apparatus for decoding a noise signal according to another embodiment of the present invention.

FIG. 9 is a block diagram showing an apparatus for decoding a noise signal according to another embodiment of the present invention. The apparatus for decoding a noise signal includes a demultiplexer 900, a spectral component decoder 910, a noise component decoder 920, a comparator 930, a spectral component selector 940, a band selector 950, a synthesizer 960, and a domain inverter 970.

The demultiplexer 900 receives the bit stream transmitted from the encoding apparatus through an input terminal IN and demultiplexes the bit stream.

The spectral component decoder 910 decodes the spectral components that are selected from the audio signal on a predetermined basis and encoded by the encoding apparatus. Here, examples of the spectral components selected and encoded by the encoding apparatus include first to twelfth spectral components 200 to 255 shown in FIG. 2.

The noise component decoder 920 decodes noise components, except for the spectral components selected in the encoding apparatus. Here, an example of the noise components includes a curve 260 shown in FIG. 2. The noise components decoded by the noise component decoder 920 include a noise level representing an energy value of each sub-band and noise components decoded by using a low frequency band signal. In addition, the noise component decoder 920 may generate a random noise signal.

The comparator 930 compares each of the spectral components decoded by the spectral component decoder 910 with noise components. For example, the comparator 930 calculates a ratio value by dividing each of the spectral components by the noise components.

The spectral component selector 940 selects, by using the result of the comparison performed by the comparator 930, spectral components which are not to be output as noise components corresponding to lengths of predetermined sections provided near the spectral components from among the spectral components selected by the spectral component decoder 910. For example, the spectral component selector 940 selects a spectral component having a ratio value, which is calculated by dividing a spectral component by a noise component, that is larger than a predetermined value.

For example, as shown in FIG. 2, the first to twelfth spectral components 200 to 255 are decoded by the spectral component decoder 910, and noise components as the curve 260 is decoded by the noise component decoder 920. Here, the spectral component selector 940 selects the first, third, fifth, seventh, and eleventh spectral components 200, 210, 220, 230, and 250 having ratio values obtained by dividing each of the spectral components by the noise components, which are larger than the predetermined value.

The band selector 950 selects sub-bands having the spectral components selected by the spectral component extractor 910, the number of which is larger than a predetermined value. The band selector 950 determines whether or not the number of spectral components in each sub-band is larger than the predetermined value, because the sound quality is not deteriorated in such sub-bands even when the corresponding noise components are not synthesized.

For example, referring to FIG. 2, when it is assumed that the predetermined number of reference values which are used to select the sub-bands is four, the band selector 950 selects the sub-band 280 having five spectral components, the number of which is larger than the predetermined number four. However, the apparatus for decoding a noise signal according to the current embodiment may not necessarily include the band selector 950.

The synthesizer 960 synthesizes the spectral components decoded by the spectral component decoder 910 with the noise components decoded by the noise component decoder 920.

Here, the synthesizer 960 synthesizes the spectral components with the noise components excluding noise components corresponding to the predetermined sections provided near the spectral components selected by the spectral component selector 940.

For example, referring to FIG. 4, the synthesizer 960 performs the synthesis excluding the noise components in the sections 265, 270, 275, 277, and 285 provided near the first, third, fifth, seventh, and eleventh spectral components 200, 210, 220, 230, and 250 corresponding to the spectral components selected by the encoding apparatus.

In addition, the synthesizer 960 performs the synthesis excluding noise components provided to sub-bands selected by the band selector 950. For example, as shown in FIG. 4, the synthesizer 960 performs the synthesis excluding noise components provided to the sub-band 280.

The domain inverter 970 inverts the signal synthesized by the synthesizer 960 from the frequency domain to the time domain to output the inverted signal through an output terminal OUT.

Figure 10:
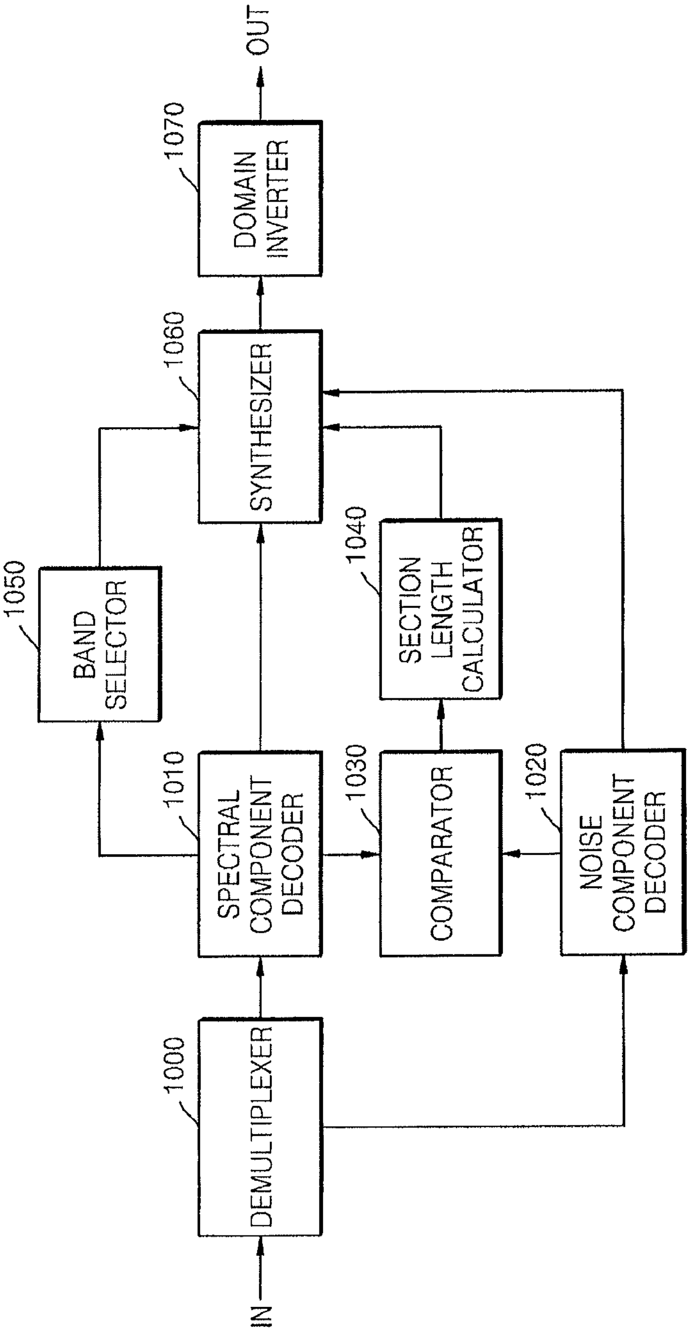
FIG. 10 is a block diagram showing an apparatus for decoding a noise signal according to another embodiment of the present invention.

FIG. 10 is a block diagram showing an apparatus for decoding a noise signal according to another embodiment of the present invention. The apparatus for decoding a noise signal includes a demultiplexer 1000, a spectral component decoder 1010, a noise component decoder 1020, a comparator 1030, a section length calculator 1040, a band selector 1050, a synthesizer 1060, and a domain inverter 1070.

The demultiplexer 1000 receives the bit stream transmitted from the encoding apparatus through an input terminal IN and demultiplexes the bit stream.

The spectral component decoder 1010 decodes the spectral components that are selected from the audio signal on a predetermined basis and encoded by the encoding apparatus. Here, examples of the spectral components selected and encoded by the encoding apparatus include first to twelfth spectral components 600 to 655 shown in FIG. 6.

The noise component decoder 1020 decodes noise components, except for the spectral components selected in the encoding apparatus. Here, an example of the noise components includes the curve 660 shown in FIG. 6. The noise components decoded by the noise component decoder 1020 include a noise level representing an energy value of each sub-band and noise components decoded by using a low frequency band signal. In addition, the noise component decoder 1020 may generate a random noise signal.

The comparator 1030 compares each of the spectral components decoded by the spectral component decoder 1010 with noise components. For example, the comparator 1030 calculates a ratio value by dividing each of the spectral components by the noise components.

The section length calculator 1040 calculates lengths of spectral sections which exclude output noise components near each of the spectral components decoded by the spectral component decoder 1010 by using the result of the comparison performed by the comparator 1030.

Here, the section length calculator 1040 calculates the lengths of the sections which are not to be used to output noise components to be proportionate to each of the spectral components decoded by the spectral component decoder 1010 and ratio values of noise components decoded by the noise component decoder 1020. For example, as shown in FIG. 6, as ratio values calculated by dividing each of the spectral components by noise components increase in the order of the third, twelfth, first, second, and eleventh spectrum components 610, 655, 600, 605, and 650, lengths of sections which are not to be used to output noise components corresponding to each of the spectrum components are calculated to increase in the order of sections 675, 699, 665, 670, and 693.

In addition, the section length calculator 1040, when the number of spectral components decoded by the spectral component decoder 1010 in a predetermined interval is more than one, compares a spectral component with a noise level for a smallest frequency from among the plurality of spectral components, provides a section which is not used to output noise components in a section smaller than the smallest frequency, and calculates a length of the section. In addition, the section length calculator 1040 compares a spectral component with a noise level for a largest frequency from among the plurality of spectral components, provides a section which is not to output noise components in a section larger than the largest frequency, and calculates a length of the section.

For example, referring to FIG. 6, examples of spectral components close to each other include fourth to fifth spectral components 615 to 620 and sixth to tenth spectral components 625 to 645. For the fourth to fifth spectral components 615 to 620, the fourth spectral component 615 and the noise level are compared with each other, a length of a section which is not used to output noise components is calculated for a section equal to or smaller than a frequency of the fourth spectral component 615, the fifth spectral component 620 and the noise level are compared with each other, and a length of a section which is not used to output noise components is calculated for a section equal to or larger than a frequency of the fifth spectral component 620. Since a ratio value for the fourth spectral component 615 is larger than a ratio value for the fifth spectral component 620, the length of the section 680 smaller than the frequency of the fourth spectral component 615 is larger than the length of the section 685 larger than the frequency of the fifth spectral component 620. For the sixth to tenth spectral components 625 to 645, an energy value and a noise level of the sixth spectral component 625 are compared with each other, a length of a section which is not used to output noise components is calculated for a section equal to or smaller than a frequency of the sixth spectral component 625, an energy value and a noise level of the tenth spectral component 645 are compared with each other, and a length of a section which is not used to output noise components is calculated for a section equal to or larger than a frequency of the tenth spectral component 645.

The band selector 1050 selects sub-bands having the spectral components decoded by the spectral component decoder 1010, the number of which is larger than a predetermined value. The band selector 1050 determines whether or not the number of spectral components in each sub-band is larger than the predetermined value, because the sound quality is not significantly deteriorated in those sub-bands even when the noise components are not synthesized.

For example, referring to FIG. 6, when it is assumed that the predetermined number of reference values which are used by the band selector 1050 to select the sub-bands is four, the band selector 1050 does not select a sub-band containing a plurality of spectral components corresponding to the fourth to fifth spectral components 615 to 620 in a unit sub-band as the number of spectral components is less than four. However, the band selector 1050 selects a corresponding sub-band including the sixth to tenth spectral components 625 to 645 in the unit sub-band as the number of spectral components is more than four.

The synthesizer 1060 synthesizes the spectral components decoded by the spectral component decoder 1010 with the noise components decoded by the noise component decoder 1020.

Here, the synthesizer 1060 synthesizes the spectral components with the noise components excluding noise components corresponding to the lengths of the sections provided near the spectral components calculated by the section length calculator 1040. For example, referring to FIG. 8, the synthesizer 1060 performs the synthesis excluding noise components in sections corresponding to lengths of the sections 665, 670, 675, 680, 685, 693, and 699 corresponding to the lengths of the sections of each of the spectral components calculated by the section length calculator 1040.

In addition, the synthesizer 1060 performs the synthesis excluding noise components in sub-bands selected by the band selector 1050. For example, as shown in FIG. 8, the synthesizer 1060 performs the synthesis excluding noise components in the sub-band 690.

The domain inverter 1070 inverts the signal synthesized by the synthesizer 1060 from the frequency domain to the time domain to output the inverted signal through an output terminal OUT.

Figure 11:
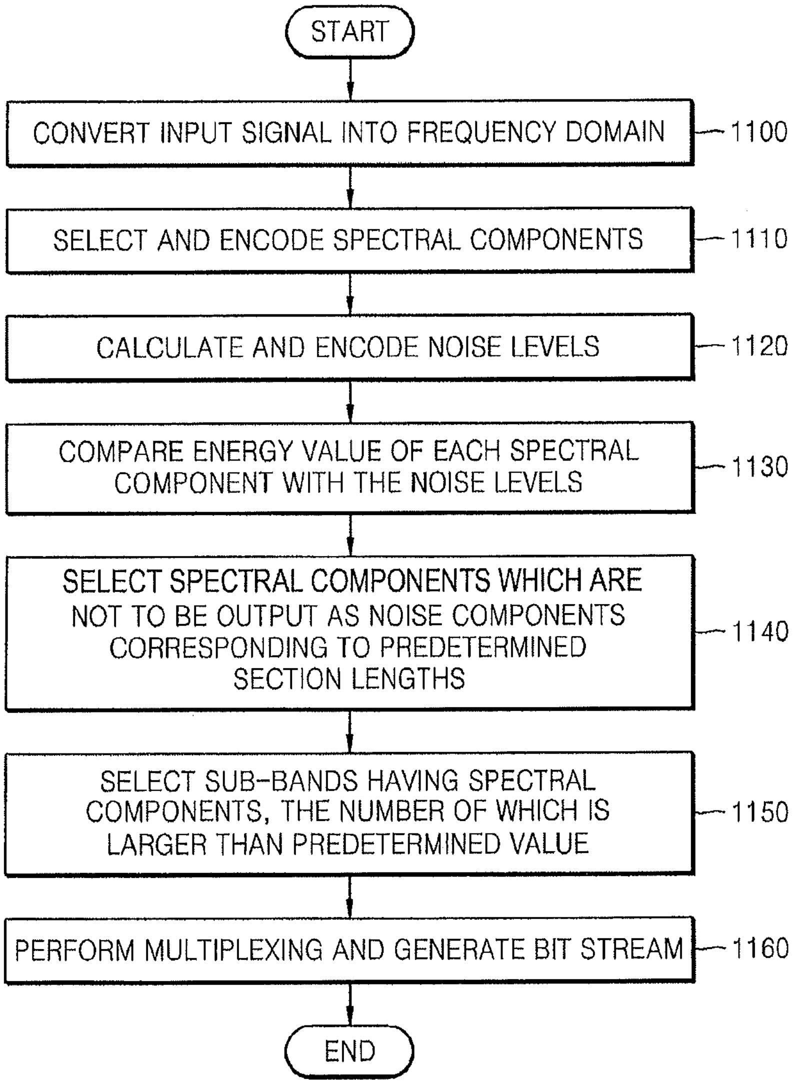
FIG. 11 is a flowchart showing a method of encoding a noise signal according to an embodiment of the present invention.

FIG. 11 is a flowchart showing a method of encoding a noise signal according to an embodiment of the present invention.

First, an input signal is converted from the time domain into the frequency domain (operation 1100).

On a predetermined basis, a predetermined number of spectral components are selected from the signal converted into the frequency domain in operation 1100 (operation 1110). For example, referring to FIG. 2, the spectral components selected in operation 1110 include the first to twelfth spectral components 200 to 255. In addition, in operation 1110, the selected spectral components are encoded.

In operation 1110, the spectral components may be selected by using the following methods. First, an SMR value is calculated, and signals having values larger than a masking threshold are selected as important frequency components. Second, in consideration of a predetermined weight value, a spectral peak is extracted, and important frequency components are selected. Third, an SNR value is calculated for each sub-band, and frequency components having peak values larger than a predetermined magnitude are selected from among sub-bands having low SNR values as important frequency components. The aforementioned three methods may be separately performed, or one or more methods may be combined and performed. The aforementioned three methods are only examples and the present invention is not limited thereto.

Noise levels for noise components, except for the spectral components selected in operation 1110 from the signal converted in operation 1100, are calculated (operation 1120). In order to calculate the noise levels in operation 1120, the signal is broken into sub-bands and an energy value of a noise component for each sub-band is calculated. In addition, in operation 1120, the noise level of each sub-band is encoded.

The energy value of each of the spectral components selected in operation 1110 is compared with a noise level of a sub-band including a corresponding spectral component (operation 1130). For example, in operation 1130, a ratio value is calculated by dividing the energy value of each of the spectral components by the noise level of the sub-band including the corresponding spectral component.

By using the result of the comparison performed in operation 1130, spectral components which are not to be output as noise components corresponding to lengths of predetermined sections provided near the spectral components are selected from among the spectral components selected in operation 1110 (operation 1140). For example, in operation 1140, spectral components having ratio values that are calculated by dividing the energy value of each spectral component by the noise level of the sub-band including the corresponding spectral component and are larger than a predetermined value, are selected. In addition, information on positions of the spectral components selected in this case is encoded in operation 1140.

For example, as shown in FIG. 2, it is assumed that the first to twelfth spectral components 200 to 255 are selected in operation 1110, and noise levels are calculated as shown by a curve 260, in operation 1120. In addition, in operation 1140, the first, third, fifth, seventh, and eleventh spectral components 200, 210, 220, 230, and 250 having ratio values which are calculated by dividing the energy value of each spectral component by the noise level of the sub-band including the corresponding spectral component, and are larger than the predetermined value, are selected.

Sub-bands having the spectral components selected in operation 1110, the number of which is larger than a predetermined value, are selected from each sub-band (operation 1150). It is determined in operation 1150 whether or not the number of spectral components in each sub-band is larger than the predetermined value because the sound quality is not significantly deteriorated even though a decoding apparatus does not synthesize noise components.

Referring to FIG. 2, when it is assumed that the predetermined number of reference values which are used to select the sub-bands in operation 1150 is four, a sub-band 280 having five spectral components, the number of which is larger than the predetermined number four, is selected in operation 1150. In addition, information on the selected sub-bands is encoded in operation 1150. However, the method of encoding a noise signal according to the current embodiment may not necessarily include operation 1150.

The spectral components encoded in operation 1110, the noise levels encoded in operation 1120, information on the spectral components selected in operation 1140, and information on the sub-bands selected in operation 1150 are multiplexed to generate a bit stream (operation 1160).

Figure 12:
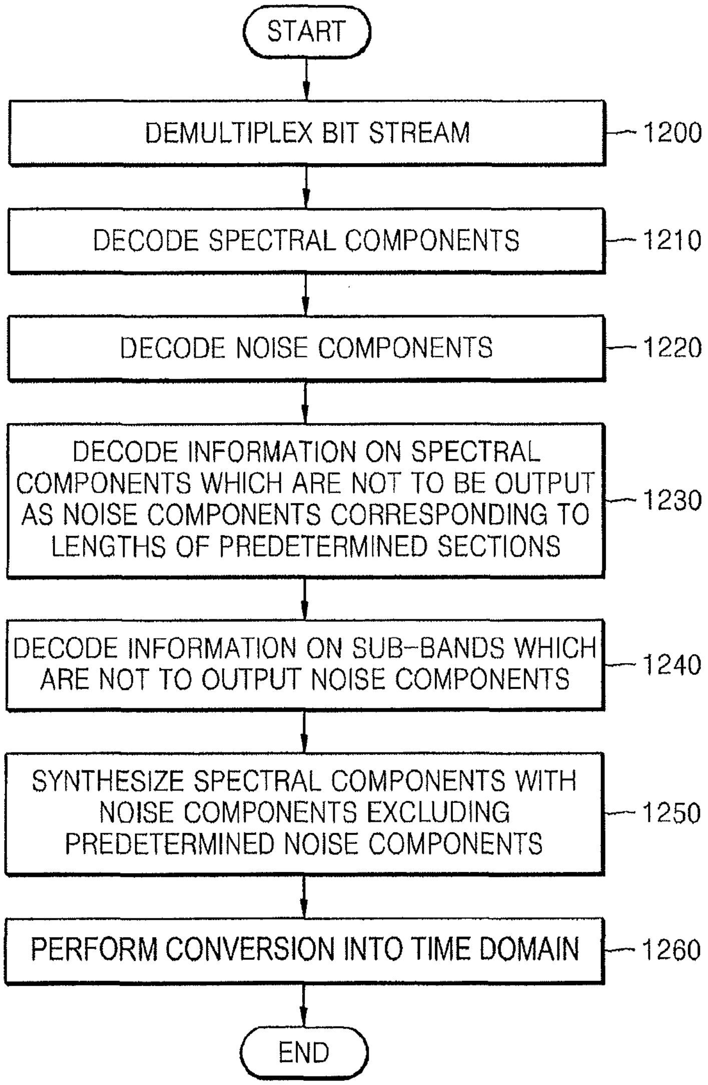
FIG. 12 is a flowchart showing a method of decoding a noise signal according to an embodiment of the present invention.

FIG. 12 is a flowchart showing a method of decoding a noise signal according to an embodiment of the present invention.

First, the bit stream transmitted from the encoding apparatus is demultiplexed (operation 1200).

The spectral components which are selected from the audio signal on a predetermined basis and encoded by the encoding apparatus are decoded (operation 1210). Here, examples of the spectral components selected and encoded by the encoding apparatus include first to twelfth spectral components 200 to 255 shown in FIG. 4.

The noise components exclusive of the spectral components selected in the encoding apparatus, are decoded (operation 1220). Here, an example of the noise component includes a curve 260 shown in FIG. 2.

Information on positions of the spectral components which are selected in the encoding apparatus and are not to be output as noise components, corresponding to lengths of predetermined sections provided near spectral components, is decoded (operation 1230).

Information on the sub-bands which are selected in the encoding apparatus and have the spectral components selected from each sub-band, the number of which is more than a predetermined value, is decoded (operation 1240). In other words, information on the sub-bands which are not used to output noise components is decoded in operation 1240. However, the method of decoding a noise signal according to the current embodiment may not necessarily include operation 1240.

The spectral components decoded in operation 1210 and the noise components decoded in operation 1220 are synthesized (operation 1250).

Here, in operation 1250, the noise components are synthesized with the spectral components excluding noise components corresponding to the lengths of the predetermined sections provided near the selected spectral components according to the information on the positions of the spectral components decoded in operation 1230. For example, referring to FIG. 4, in operation 1250, the synthesis is performed on the noise components excluding noise components in sections 265, 270, 275, 277, and 285 provided near the first, third, fifth, seventh, and eleventh spectral components 200, 210, 220, 230, and 250 corresponding to the spectral components selected in the encoding apparatus.

In addition, in operation 1250, noise components excluding noise components provided to sub-bands corresponding to the information on the sub-bands decoded in operation 1240, are synthesized. For example, as shown in FIG. 4, in operation 1250, the synthesis is performed on the noise components excluding noise components in a sub-band 280.

The signal synthesized in operation 1250 is transformed from the frequency domain to the time domain (operation 1260).

Figure 13:
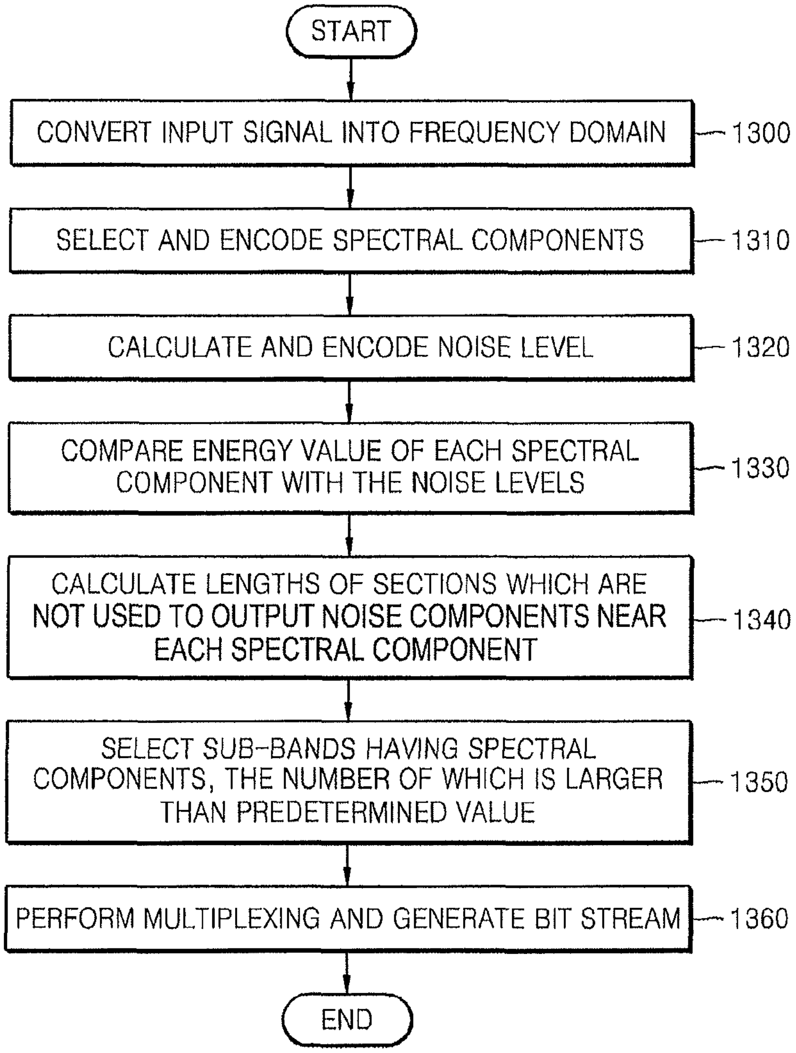
FIG. 13 is a flowchart showing a method of encoding a noise signal according to another embodiment of the present invention.

FIG. 13 is a flowchart showing a method of encoding a noise signal according to another embodiment of the present invention.

First, an input signal is converted from the time domain into the frequency domain (operation 1300).

On a predetermined basis, spectral components corresponding to a predetermined number are selected from the signal converted into the frequency domain in operation 1300 (operation 1310). For example, referring to FIG. 6, the spectral components selected in operation 1310 include the first to twelfth spectral components 600 to 655. In addition, in operation 1310, the selected spectral components are encoded.

Here, in operation 1300, the spectral components may be selected by using the following methods. First, an SMR value is calculated, and signals having values larger than a masking threshold are selected as important frequency components. Second, in consideration of a predetermined weight value, a spectral peak is extracted, and important frequency components are selected. Third, an SNR value is calculated for each sub-band, and frequency components having peak values larger than a predetermined magnitude are selected from among sub-bands having low SNR values as important frequency components. The aforementioned three methods may be separately performed, or one or more methods may be combined and performed. The aforementioned three methods are only examples and the present invention is not limited thereto.

Noise levels for noise components, excluding the spectral components selected in operation 1310 from the signal converted in operation 1300, are calculated (operation 1320). In order to calculate the noise levels in operation 1320, the signal is separated into sub-bands and an energy value of a noise component for each sub-band is calculated. In addition, in operation 1320, the calculated noise level of each sub-band is encoded.

The energy value of each of the spectral components selected in operation 1310 is compared with a noise level of a sub-band including a corresponding spectral component (operation 1330). For example, in operation 1330, a ratio value is calculated by dividing the energy value of each of the spectral components by the noise level of the sub-band including the corresponding spectral component.

By using the result of the comparison performed in operation 1330, lengths of spectral sections which are not to output noise components near each of the spectral components extracted in operation 1310 are calculated (operation 1340). In addition, in operation 1340, the lengths of the sections calculated corresponding to each spectral component are encoded.

Here, in operation 1340, the lengths of the sections which are not to output noise components are calculated to be proportionate to the energy of each spectrum extracted in operation 1310 and ratio values of noise levels calculated in operation 1320. For example, as shown in FIG. 6, as ratio values calculated by dividing the energy value of each of the spectral components by the noise level of sub-band including corresponding spectral component increase in the order of the third, twelfth, first, second, and eleventh spectrum components 610, 655, 600, 605, and 650, lengths of sections are calculated to increase in the order of sections 675, 699, 665, 670 and 693 which are not to output noise components corresponding to the spectrum components in FIG. 8.

In addition, in operation 1340, when the number of spectral components selected in operation 1310 in a predetermined interval is more than one, an energy value and a noise level of a spectral component for a smallest frequency from among the plurality of spectral components are compared with each other, so that a section which is not to output noise components is a section smaller than the smallest frequency in order to calculate a length of the section. In addition, an energy value and a noise level of a spectral component for a largest frequency from among the plurality of spectral components are compared with each other, so that a section which is not to output noise components is a section larger than the largest frequency in order to calculate a length of the section.

For example, referring to FIG. 6, examples of spectral components close to each other include fourth to fifth spectral components 615 to 620 and sixth to tenth spectral components 625 to 645. For the fourth to fifth spectral components 615 to 620, an energy value and a noise level of the fourth spectral component 615 are compared with each other, a length of a section which is not to output noise components is calculated for a section equal to or smaller than a frequency of the fourth spectral component 615, an energy value and a noise level of the fifth spectral component 620 are compared with each other, and a length of a section which is not to output noise components is calculated for a section equal to or larger than a frequency of the fifth spectral component 620. Since a ratio value for the fourth spectral component 615 is larger than a ratio value for the fifth spectral component 620, the length of the section 680 smaller than the frequency of the fourth spectral component 615 is larger than the length of the section 685 larger than the frequency of the fifth spectral component 620. For the sixth to tenth spectral components 625 to 645, an energy value and a noise level of the sixth spectral component 625 are compared with each other, a length of a section which is not to output noise components is calculated for a section equal to or smaller than a frequency of the sixth spectral component 625, an energy value and a noise level of the tenth spectral component 645 are compared with each other, and a length of a section which is not to output noise components is calculated for a section equal to or larger than a frequency of the tenth spectral component 645.

Sub-bands having the spectral components selected in operation 1310 and the number of which is larger than a predetermined value, are selected from each sub-band. It is determined in operation 1350 whether the number of spectral components in each sub-band is larger than the predetermined value, because the sound quality is not significantly deteriorated in those sub-bands even when the decoding apparatus does not synthesize noise components. However, the method of encoding a noise signal according to the current embodiment may not necessarily include operation 1350.

For example, referring to FIG. 6, when it is assumed that the predetermined number of reference values which are used to select the sub-bands is four in operation 1350, a sub-band providing a plurality of spectral components corresponding to the fourth to fifth spectral components 615 to 620 in a unit sub-band is not selected in operation 1350 since the number of spectral components is less than four. However, a sub-band including the sixth to tenth spectral components 625 to 645 in the unit sub-band is selected in operation 1350 as the number of spectral components is more than four.

The spectral components encoded in operation 1310, the noise levels encoded in operation 1320, information on the lengths of the sections calculated corresponding to each spectral component in operation 1340, and information on the sub-bands selected in operation 1350 are multiplexed in order to generate a bit stream, which is output through an output terminal OUT (operation 1360).

Figure 14:
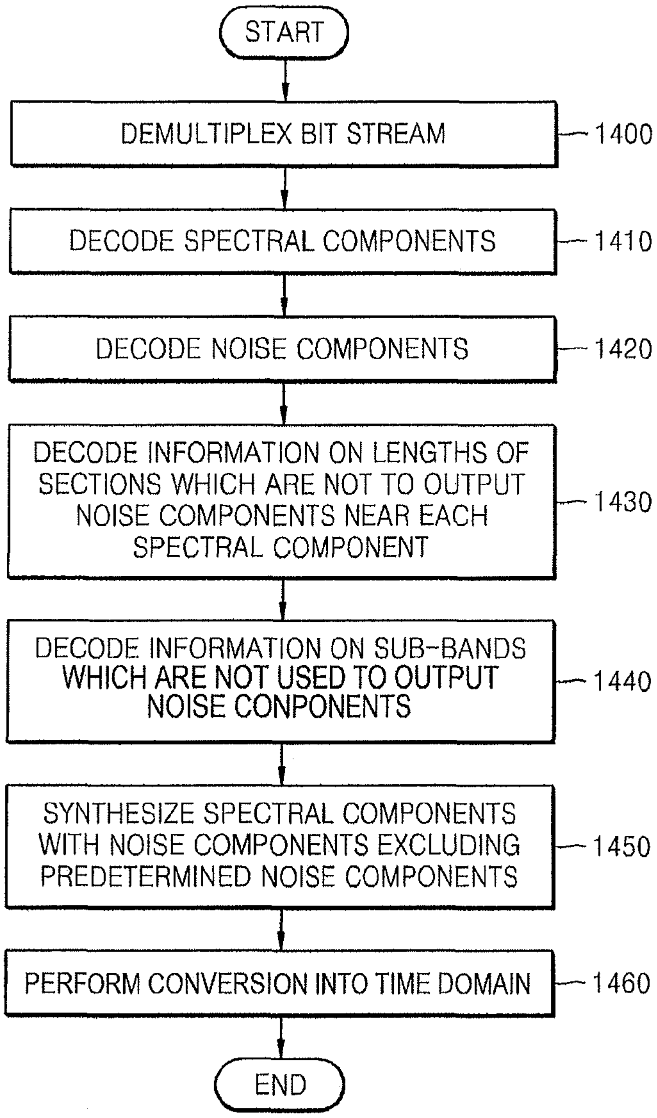
FIG. 14 is a flowchart showing a method of decoding a noise signal according to another embodiment of the present invention.

FIG. 14 is a flowchart showing a method of decoding a noise signal according to another embodiment of the present invention.

First, the bit stream transmitted from the encoding apparatus is demultiplexed (operation 1400).

The spectral components, which are selected from the audio signal on a predetermined basis and encoded by the encoding apparatus, are decoded (operation 1410). Here, examples of the spectral components selected and encoded by the encoding apparatus include first to twelfth spectral components 600 to 655 shown in FIG. 6.

The noise components, except for the spectral components selected in the encoding apparatus, are decoded (operation 1420). Here, an example of the noise component includes a curve 660 shown in FIG. 6.

Information on positions of sections which are provided near each of the spectral components decoded in operation 1410 is decoded (operation 1430).

Information on the sub-bands which are selected in the encoding apparatus and have the spectral components selected from each sub-band, the number of which is more than a predetermined value, is decoded (operation 1440). In other words, information on the sub-bands which are not to output noise components is decoded in operation 1440. However, the method of decoding a noise signal according to the current embodiment may not necessarily include operation 1440.

The spectral components decoded in operation 1410 and the noise components decoded in operation 1420 are synthesized (operation 1450).

Here, in operation 1450, the noise components are synthesized with the spectral components excluding noise components corresponding to the lengths of the sections for each of the spectral components decoded in operation 1430. For example, referring to FIG. 8, in operation 1450, the synthesis is performed on the noise components excluding noise components in sections corresponding to the lengths of the sections 665, 670, 675, 680, 685, 693, and 699.

In addition, in operation 1450, noise components excluding noise components provided to sub-bands corresponding to the information on the sub-bands decoded in operation 1440 are synthesized. For example, as shown in FIG. 8, the synthesis is performed on the noise components excluding noise components provided to a sub-band 690.

The signal synthesized in operation 1450 is converted from the frequency domain to the time domain (operation 1460).

Figure 15:
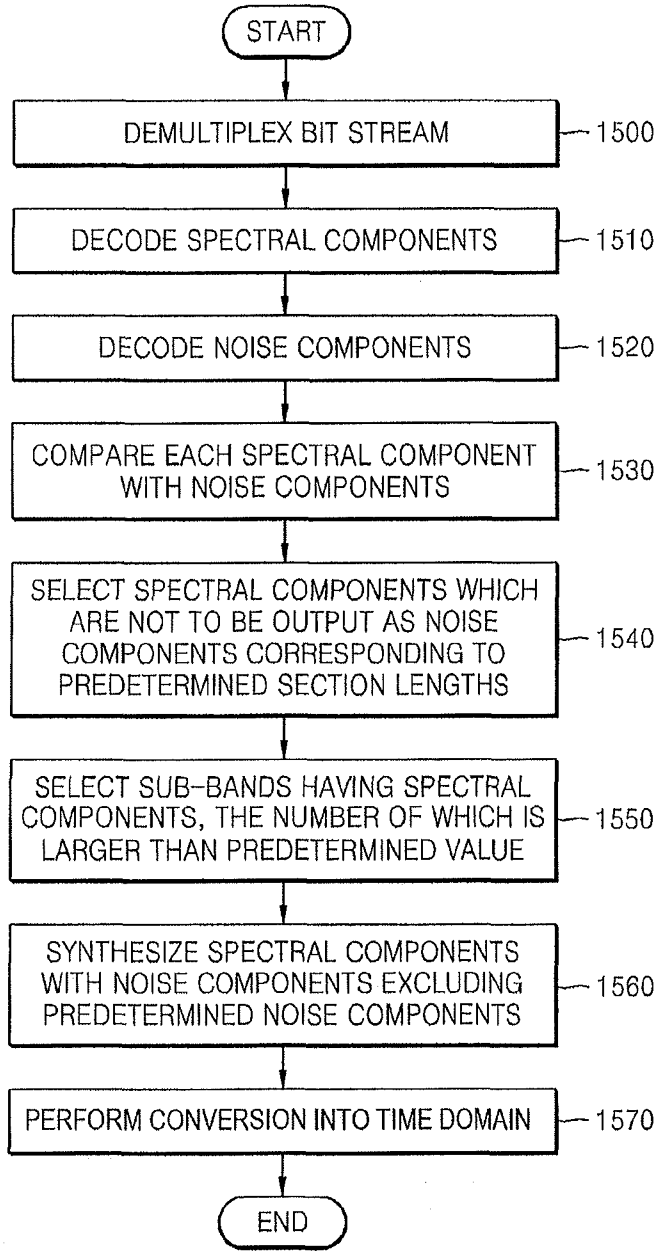
FIG. 15 is a flowchart showing a method of decoding a noise signal according to another embodiment of the present invention.

FIG. 15 is a flowchart showing a method of decoding a noise signal according to another embodiment of the present invention.

First, the bit stream transmitted from the encoding apparatus is demultiplexed (operation 1500).

The spectral components selected and encoded by the encoding apparatus are decoded (operation 1510). Here, examples of the spectral components selected and encoded by the encoding apparatus include first to twelfth spectral components 200 to 255 shown in FIG. 2.

Noise components, exclusive of the spectral components selected from the audio signal on a predetermined basis in the encoding apparatus, are decoded (operation 1520). Here, an example of the noise components includes a curve 260 as shown in FIG. 2. The noise components decoded in operation 1520 include a noise level representing an energy value of each sub-band and noise components decoded by using a low frequency band signal. In addition, noises may be randomly generated in operation 1520.

Each of the spectral components decoded in operation 1510 is compared with noise components (operation 1530). For example, a ratio value is calculated by dividing each of the spectral components by the noise components in operation 1530.

By using the result of the comparison performed in operation 1530, spectral components which are not to be output as noise components corresponding to lengths of predetermined sections provided near the spectral components, are selected from among the spectral components decoded in operation 1510 (in operation 1540). For example, in operation 1540, a spectral component having a ratio value which is calculated by dividing each of the spectral components by each of the noise components and that is larger than a predetermined value, is selected.

For example, as shown in FIG. 2, the first to twelfth spectral components 200 to 255 are decoded in operation 1510, and a noise component as the curve 260 is decoded in operation 1520. Here, in operation 1540, the first, third, fifth, seventh, and eleventh spectral components 200, 210, 220, 230, and 250 having ratio values which are calculated by dividing each of the spectral components by the noise components and which are larger than the predetermined value, are selected.

Sub-bands having the spectral components which are decoded in operation 1510, and the number of which is larger than a predetermined value, are selected (operation 1550). It is determined in operation 1550 whether or not the number of spectral components in each sub-band is larger than the predetermined value, because the sound quality in those bands is not deteriorated even when the noise components are not synthesized.

For example, referring to FIG. 2, when it is assumed that the predetermined number of reference values which are used to select the sub-bands is four, the sub-band 280 having five spectral components, the number of which is larger than the predetermined number four, is selected in operation 1550. However, the method of decoding a noise signal according to the current embodiment may not necessarily include operation 1550.

The spectral components decoded in operation 1510 and the noise components decoded in operation 1520 are synthesized (operation 1560).

Here, in operation 1560, the spectral components are synthesized with noise components excluding noise components corresponding to the predetermined sections provided near the spectral components selected in operation 1540.

For example, referring to FIG. 4, in operation 1560, the synthesis is performed on the noise components excluding noise components in sections 265, 270, 275, 277, and 285 provided near the first, third, fifth, seventh, and eleventh spectral components 200, 210, 220, 230, and 250 corresponding to the spectral components selected in the encoding apparatus.

In addition, in operation 1560, noise components excluding noise components provided to sub-bands selected in operation 1550 are synthesized. For example, as shown in FIG. 4, in operation 1560, the synthesis is performed on the noise components excluding noise components provided to a sub-band 280.

The signal synthesized in operation 1560 is converted from the frequency domain to the time domain (operation 1570).

Figure 16:
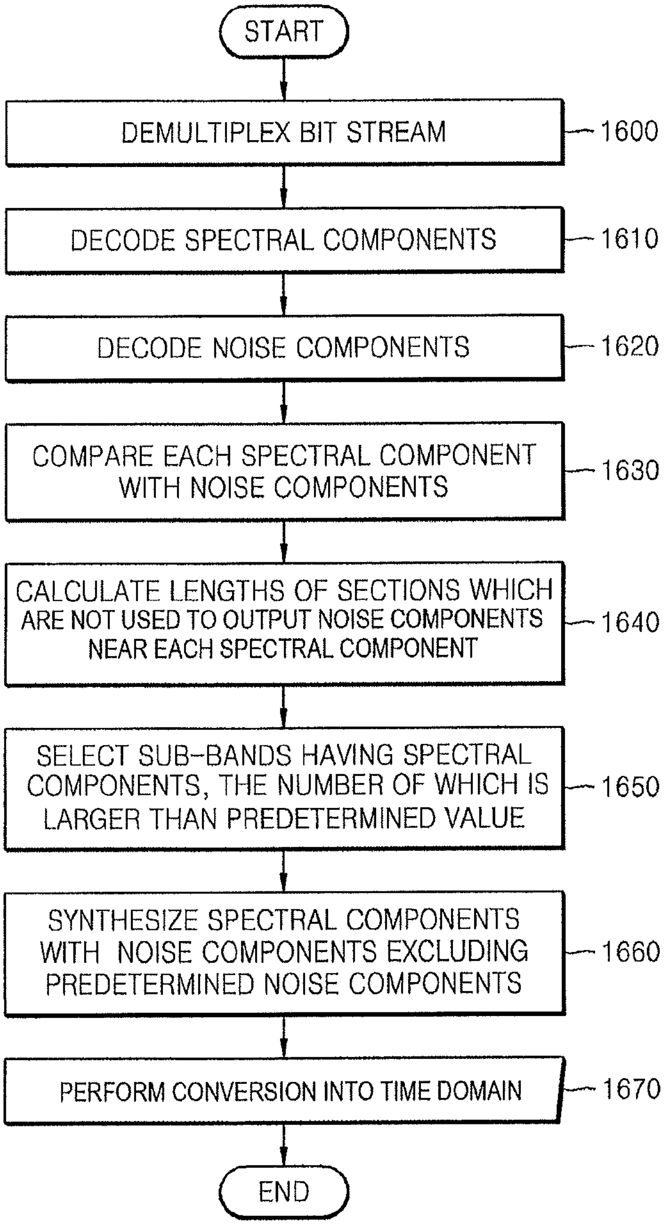
FIG. 16 is a flowchart showing a method of decoding a noise signal according to another embodiment of the present invention.

FIG. 16 is a flowchart showing a method of decoding a noise signal according to another embodiment of the present invention.

First, the bit stream transmitted from the encoding apparatus is demultiplexed (operation 1600).

The spectral components which are selected from the audio signal on a predetermined basis and encoded by the encoding apparatus are decoded (operation 1610). Examples of the spectral components selected and encoded by the encoding apparatus include first to twelfth spectral components 600 to 655 shown in FIG. 6.

Noise components, excluding the spectral components selected from the audio signal on the predetermined basis in the encoding apparatus, are decoded (operation 1620). Here, an example of the noise components includes a curve shown in FIG. 6. The noise components decoded in operation 1620 include a noise level representing an energy value of each of the sub-bands and noise components decoded by using a low frequency band signal. In addition, noises may be randomly generated in operation 1620.

Each of the spectral components decoded in operation 1610 is compared with the noise components (operation 1630). For example, a ratio value is calculated by dividing each of the spectral components by the noise components in operation 1630.

By using the result of the comparison performed in operation 1630, lengths of sections which are not to output noise components near each of the spectral components decoded in operation 1610 are calculated (operation 1640).

In operation 1640, the lengths of the sections which are not used to output noise components are calculated to be proportionate to each of the spectrum components decoded in operation 1610 and ratio values of noise levels decoded in operation 1620. For example, as shown in FIG. 6, as ratio values calculated by dividing each of the spectral components by noise components increase in the order of the third, twelfth, first, second, and eleventh spectrum components 610, 655, 600, 605, and 650, lengths of sections are calculated to increase in the order of sections 675, 699, 665, 670, and 693 which are not to output noise components corresponding to each of the spectrum components in FIG. 8.

In addition, in operation 1640, when the number of spectral components decoded in operation 1610 in a predetermined interval is more than one, a spectral component and a noise level for a smallest frequency from among the plurality of spectral components are compared with each other, so that a section which is not used to output noise components is provided to a section smaller than the smallest frequency in order to calculate a length of the section. In addition, a spectral component and a noise level for a largest frequency from among the plurality of spectral components are compared with each other, so that a section which is not to output noise components is a section larger than the largest frequency in order to calculate a length of the section.

For example, referring to FIG. 6, examples of spectral components close to each other include fourth to fifth spectral components 615 to 620 and sixth to tenth spectral components 625 to 645. For the fourth to fifth spectral components 615 to 620, an energy value and a noise level of the fourth spectral component 615 are compared with each other, a length of a section which is not to output noise components is calculated for a section equal to or smaller than a frequency of the fourth spectral component 615, an energy value and a noise level of the fifth spectral component 620 are compared with each other, and a length of a section which is not to output noise components is calculated for a section equal to or larger than a frequency of the fifth spectral component 620. Since a ratio value for the fourth spectral component 615 is larger than a ratio value for the fifth spectral component 620, the length of the section 680 smaller than the frequency of the fourth spectral component 615 is larger than the length of the section 685 larger than the frequency of the fifth spectral component 620. For the sixth to tenth spectral components 625 to 645, an energy value and a noise level of the sixth spectral component 625 are compared with each other, a length of a section which is not to output noise components is calculated for a section equal to or smaller than a frequency of the sixth spectral component 625, an energy value and a noise level of the tenth spectral component 645 are compared with each other, and a length of a section which is not to output noise components is calculated for a section equal to or larger than a frequency of the tenth spectral component 645.

Sub-bands having the spectral components which are decoded in operation 1610 and the number of which is larger than a predetermined value are selected (operation 1650). It is determined in operation 1650 whether or not the number of spectral components in each sub-band is larger than the predetermined value, because the sound quality in those sub-bands is not deteriorated even when the noise components are not synthesized.

For example, referring to FIG. 6, when it is assumed that the predetermined number of reference values used to select the sub-bands is four in operation 1650, a sub-band providing a plurality of spectral components corresponding to the fourth to fifth spectral components 615 to 620 in a unit sub-band is not selected in operation 1650 as the number of spectral components is less than four. However, a sub-band including the sixth to tenth spectral components 625 to 645 in the unit sub-band is selected in operation 1650 as the number of spectral components is more than four.

The spectral components decoded in operation 1610 and the noise components decoded in operation 1620 are synthesized (operation 1660).

Here, in operation 1660, the spectral components are synthesized with the noise components excluding noise components corresponding to the lengths of the sections provided near the spectral components calculated in operation 1640. For example, referring to FIG. 8, in operation 1660, the noise components excluding noise components in sections corresponding to the lengths of the sections 665, 670, 675, 680, 685, 693, and 699 corresponding to the lengths of sections for the spectral components calculated in operation 1640 are synthesized.

In addition, in operation 1660, noise components excluding noise components provided to sub-bands selected in operation 1650 are synthesized. For example, as shown in FIG. 8, the synthesis is performed on the noise components excluding noise components provided to a sub-band 690.

The signal synthesized in operation 1660 is converted from the frequency domain to the time domain (operation 1670).

According to embodiments of the present invention, the apparatus and method of encoding and decoding a noise signal decides sections which are not to output noise components near important spectral components and sub-bands which are not used to output noise components to perform encoding and decoding.

Accordingly, the efficiency of encoding and decoding an audio signal increases, and sound quality can be improved using less bits.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of noise filling in a decoding apparatus, the method comprising:

selecting, performed by at least one processing device, a subband that noise filling is applied to, from among a plurality of subbands, based on bit allocation of spectrum coefficients;

obtaining a noise parameter of the selected subband; and generating noise components, based on random noise and the noise parameter; and adding the generated noise components into spectrum coefficients quantized to zero in the selected subband.

2. The apparatus of claim 1, wherein the noise parameter is associated with energy of the selected subband.

* * * * *